United States Patent
Niu et al.

(10) Patent No.: US 7,661,037 B2
(45) Date of Patent: Feb. 9, 2010

(54) LDPC CONCATENATION RULES FOR IEEE 802.11N SYSTEMS

(75) Inventors: Huaning Niu, Santa Clara, CA (US); Chiu Ngo, San Francisco, CA (US)

(73) Assignee: Samsung Electronics Co., Ltd., Suwon (KR)

(*) Notice: Subject to any disclaimer, the term of this patent is extended or adjusted under 35 U.S.C. 154(b) by 562 days.

(21) Appl. No.: 11/261,527

(22) Filed: Oct. 27, 2005

(65) Prior Publication Data
US 2007/0101229 A1    May 3, 2007

(51) Int. Cl.
*H03M 13/31* (2006.01)
(52) U.S. Cl. .......... 714/701; 714/776
(58) Field of Classification Search .......... 714/752, 714/776, 701
See application file for complete search history.

(56) References Cited

U.S. PATENT DOCUMENTS

| | | | |
|---|---|---|---|
| 6,633,856 B2 | 10/2003 | Richardson et al. | |
| 6,718,508 B2* | 4/2004 | Lodge et al. | 714/780 |
| 6,789,227 B2 | 9/2004 | De Souza et al. | |
| 6,847,678 B2* | 1/2005 | Berezdivin et al. | 375/146 |
| 6,895,547 B2 | 5/2005 | Eleftheriou et al. | |
| 7,002,900 B2* | 2/2006 | Walton et al. | 370/208 |
| 7,072,289 B1 | 7/2006 | Yang et al. | |
| 7,173,978 B2* | 2/2007 | Zhang et al. | 375/298 |
| 7,178,080 B2 | 2/2007 | Hocevar | |
| 7,213,197 B2* | 5/2007 | Jacobsen et al. | 714/800 |
| 7,260,055 B2 | 8/2007 | Wang et al. | |
| 7,283,499 B2* | 10/2007 | Priotti et al. | 370/334 |
| 7,324,605 B2* | 1/2008 | Maltsev et al. | 375/299 |
| 7,418,043 B2* | 8/2008 | Shattil | 375/260 |
| 7,526,717 B2 | 4/2009 | Kyung et al. | |
| 7,543,197 B2* | 6/2009 | Palanki et al. | 714/701 |
| 7,562,280 B2* | 7/2009 | Eroz et al. | 714/755 |
| 7,573,944 B2* | 8/2009 | Chang et al. | 375/260 |
| 7,581,159 B2* | 8/2009 | Hocevar | 714/790 |
| 2002/0042899 A1* | 4/2002 | Tzannes et al. | 714/786 |
| 2003/0014718 A1 | 1/2003 | De Souza et al. | |
| 2003/0126538 A1* | 7/2003 | Mejean et al. | 714/755 |
| 2004/0034828 A1 | 2/2004 | Hocevar | |
| 2004/0098659 A1* | 5/2004 | Bjerke et al. | 714/776 |
| 2004/0141548 A1* | 7/2004 | Shattil | 375/146 |
| 2005/0034053 A1* | 2/2005 | Jacobsen et al. | 714/800 |
| 2005/0091570 A1* | 4/2005 | Eroz et al. | 714/800 |
| 2005/0283707 A1* | 12/2005 | Sharon et al. | 714/758 |

(Continued)

OTHER PUBLICATIONS

R.G. Gallager, "Low density parity check codes", IRE Trans. Inform. Theory, Jan. 1962, vol. IT-8, pp. 21-28.

(Continued)

*Primary Examiner*—Stephen M Baker
(74) *Attorney, Agent, or Firm*—Kenneth L. Sherman, Esq.; Michael Zarrabian, Esq.; Myers Andras Sherman LLP

(57) ABSTRACT

Improved LDPC code structure and concatenation rules for IEEE 802.11n systems, providing two code sets per rate, one longer codeword and one shorter codeword. The longer codeword length is determined by the system parameters, while the shorter codeword length is ⅓ of the longer codeword length. A LDPC concatenation rule is provided, wherein a maximum of one extra OFDM symbol is added in padding in order to reduce the code set granularity. In order to provide improved code performance, more bits are shortened compared with puncturing, by transmitting the extra OFDM symbol. Further, all the required puncturing and shortening bits are distributed across all codewords. This scheme provides a preferred tradeoff between code complexity and over-the-air efficiency.

20 Claims, 12 Drawing Sheets

U.S. PATENT DOCUMENTS

| | | | |
|---|---|---|---|
| 2005/0283708 A1* | 12/2005 | Kyung et al. | 714/758 |
| 2005/0283709 A1 | 12/2005 | Kyung et al. | |
| 2006/0036923 A1* | 2/2006 | Hedberg et al. | 714/752 |
| 2006/0087961 A1* | 4/2006 | Chang et al. | 370/203 |
| 2006/0123241 A1 | 6/2006 | Martinian et al. | |
| 2006/0123277 A1 | 6/2006 | Hocevar et al. | |
| 2006/0140294 A1* | 6/2006 | Hottinen et al. | 375/260 |
| 2007/0022352 A1* | 1/2007 | Eroz et al. | 714/752 |
| 2007/0041458 A1 | 2/2007 | Hocevar et al. | |
| 2007/0064828 A1 | 3/2007 | Aldana et al. | |
| 2007/0101229 A1 | 5/2007 | Niu et al. | |
| 2007/0136635 A1 | 6/2007 | Niu et al. | |
| 2007/0143655 A1 | 6/2007 | Niu et al. | |
| 2007/0143656 A1 | 6/2007 | Niu et al. | |
| 2008/0256426 A1 | 10/2008 | Reid et al. | |

OTHER PUBLICATIONS

T.J. Richardson, et al., "Design of capacity-approaching irregular low-density parity-check codes", IEEE Transactions on Information Theory, Feb. 2001, pp. 619-637, vol. 47, No. 2.

T. Zhang et al., "Joint (3, k)-regular LDPC code and decoder/encoder design", IEEE Transactions on Signal Processing, Apr. 2004, pp. 1065-1079, vol. 52, No. 4.

Yeo et al., "Iterative decoder architectures", IEEE Communications Magazine, IEEE, Aug. 2003, pp. 132-140, vol. 41, No. 8.

T.J. Richardson et al., "Efficient encoding of low-density parity-check codes", IEEE Transactions on Information Theory, Feb. 2001, pp. 638-656, vol. 47, No. 2.

Chung et al., "Analysis of sum-product decoding of low-density parity-check codes using a Gaussian approximation", IEEE Transactions on Information Theory, Feb 2001, pp. 657-670, vol. 47, No. 2.

Hu et al "Progressive edge-growth Tanner graphs", IEEE Globecom 2001, pp. 995-1001.

Mackay et al., "Near Shannon limit performance of low density parity check codes," Electronics Letters, Mar. 13, 1997, p. 457-458, vol. 33, No. 6.

Mujtaba, S.A., "TGN Sync Proposal Technical Specification," doc.: IEEE 802.11- 041889r0, Aug. 2004, pp. 1-136.

Mujtaba, S.A., "TGn Sync Proposal Technical Specification," a contribution to IEEE 802.11 11-04-889r4, Mar. 2005, pp. 1-162.

Kose, C.; and Edwards, B., "WWiSE Proposal: High throughput extension to the 802.11 Standard," a contribution to IEEE 802.11, 11-05-0149r2, Mar. 2005, pp. 1-93.

Livshitz, M., et al., "TGnSync- Shortening Puncturing_Mar. 16," Nortel's PowerPoint presentation in LDPC subgroup a contribution for 802.11n, Mar. 16, 2005, pp. 1-14.

Van Veen, B.D. and Buckley, K.M., "Beamforming: A Versatile Approach to Spatial Filtering," ASSP Magazine, IEEE, vol. 5. Issue 2, Apr. 1988, pp. 4-24.

Barton, M., "Unequal Error Protection for Wireless ATM Applications," 1996, IEEE, pp. 1911-1915.

U.S. Office Action for U.S. Appl. No. 11/313,402 mailed Aug. 15, 2008.

U.S. Office Action for U.S. Appl. No. 11/313,402 mailed Jan. 29, 2009.

U.S. Office Action for U.S. Appl. No. 11/313,906 mailed Aug. 18, 2008.

U.S. Final Office Action for U.S. Appl. No. 11/313,906 mailed Mar. 2, 2009.

U.S. Office Action for U.S. Appl. No. 11/300,211 mailed Mar. 9, 2009.

* cited by examiner

LDPC CONCATENATION RULES FOR IEEE 802.11N SYSTEMS

FIELD OF THE INVENTION

The present invention relates to wireless systems, and in particular, to Low Density Parity Check encoding for wireless systems.

BACKGROUND OF THE INVENTION

Low Density Parity Check (LDPC) codes have recently attracted considerable attention owing to their capacity-approaching performance and low complexity iterative decoding. LDPC codes can be applied to a wide range of applications such as data encoding in wireless communications, satellite communications and storage. LDPC codes have also been adopted in standards such as DVB-S2 and 802.16e.

Currently, LDPC codes are considered for the high throughput Wireless Local Area Networks (WLAN) as an optional code for encoding to improve system throughput. However, several issues must be addressed in order to match the LDPC code with the unique WLAN system characteristics. First is the code size. Since LDPC code works better with longer code size, the code size must be selected to be as large as possible to insure performance. However, since WLAN systems are random access based systems, the code size is limited by the SIFS (Short Inter Frame Space) decoding budget. Therefore, the largest code size is limited to around 2K bits. Second, since high-throughput WLAN uses aggregation to improve MAC efficiency, the transmitted PPDU is large, requiring several LDPC codewords.

As such, there has been a need for a method of concatenating the LDPC codeword within a PPDU. Since transported data packets can be any size from typically about 40 bytes up to 12000 bytes and larger, the system must be able to encode variable length packets in a consistent manner. This consistency is required to ensure that the receiver always knows how to reconstruct the information field from the encoded transmitted data.

A conventional WLAN transmitter includes a FEC (forward error correction) unit, a parser, frequency interleavers, QAM modulators and OFDM (orthogonal frequency division multiplexing) modulators. The FEC unit includes convolutional code encoder and the corresponding puncture, or LDPC encoders. Conventionally, the LDPC concatenation rule utilizes shortening for the last codeword. Each packet is encoded as an entity, wherein the data boundary of a packet is respected by the encoder. Headers are encoded at R=½ and BPSK modulation. The length of the packet that is to be encoded is all that is needed to encode or decode the packet using the following rules:

Rule 1: If Length<=$N_i$ bits, where $N_i$ is the number of information bit in a LDPC codeword, then pad extra zeros to the information bit to $N_i$, encode the packet using just one LDPC codeword, shorten the codeword by removing the padded zeros from the systematic bits in the LDPC codeword.

Rule 2: If Length>$N_i$ bits, then compute $N_r$=modulo (Length, $N_i$) (in bits). Encode the first Length−$N_r$ bits using full-length, unshortened codewords, and encode the remaining $N_i$ bits using Rule 1.

Rule 3: Additional zeros are padded if necessary to meet the OFDM boundary.

However, the above approach has shortcomings. Referring to the performance graphs in FIG. 1 (showing required transmitted OFDM symbols comparison for the above conventional approach together with convolutional codes (CC)), the conventional approach is the simplest with the worst performance in terms of the extra OFDM symbol padding needed (the conventional and CC approaches are shown in the legend of FIG. 1).

BRIEF SUMMARY OF THE INVENTION

In one embodiment, the present invention provides improved LDPC concatenation rules for data encoding in WLAN systems. In one implementation the present invention provides two code sets per rate: a long codeword and a short codeword. In order to ensure constant throughput, efficient hardware reuse and layer decoding algorithm, the present invention provides a basic LDPC block structure having a variant expanding factor with fixed base matrix size.

Further, the present invention provides a LDPC concatenation rule, wherein a maximum of one extra OFDM symbol is added in order to reduce the code set granularity. In general, shortening improves the code performance while puncturing degrades the code performance. In order to guarantee that the code performance is better or the same compared with the original code, more bits are shortened compared with puncturing, by transmitting an extra OFDM symbol. Furthermore, the inventors have found that if the punctured bits are too many (e.g., when the punctured bits are greater than 30%-40% of code length), decoding fails regardless of the number of bits shortened. To prevent that result, all the required puncturing and shortening bits are distributed across all codewords. An additional benefit by distributing the shortening and puncturing bits across all codewords is that performance is uniformly improved through all codewords. This scheme provides a preferred tradeoff between code complexity and over-the-air efficiency.

As such, the present invention provides a simplified solution to the prior art shortcomings, wherein only 2 codes per rate for both 20 MHz & 40 MHz systems are utilized, and the present invention is extendable to any system parameters. In addition, at most one extra OFDM symbol padding is needed and one code per packet provides uniform performance. Inherent recommendation for LDPC usage is that LDPC is optional, using only shortening the last codeword for high rate, and lower rate transmission requires more complicated concatenation rule. Nor is there a need to update code per packet, wherein easy code optimization is provides with improved system performance.

These and other features and advantages of the present invention will be apparent from the following specification taken in conjunction with the following drawings.

DETAILED DESCRIPTION OF THE INVENTION

LDPC coding is a type of linear block coding and can be uniquely defined by a parity check matrix H. The code rate is R=M/N, where N is the number of columns in the H matrix, representing the size of the code, and M is the number of rows in the H matrix, representing the number of parity check equations. An example of a linear block code with N=7, M=3, is shown in relation (1) below:

$$H = \begin{bmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \end{bmatrix} \quad (1)$$

There are two kinds of LDPC codes, regular and irregular. A regular LDPC code contains t number of 1's per-row (row weight) and s number of 1's per column (column weight), where $s=t*(1-R)$. An irregular LDPC code contains uneven number of 1's per-column and per-row. For example, the H matrix in relation (1) is an irregular code.

LDPC codes can be efficiently decoded using a message-passing algorithm. Such an algorithm operates on the decoder graph by iteratively updating the soft message.

LDPC codes provide higher diversity order for multiple-input-multiple-output (MIMO) WLAN systems, and support encoding and shortening for multiple rates.

Figure 1:
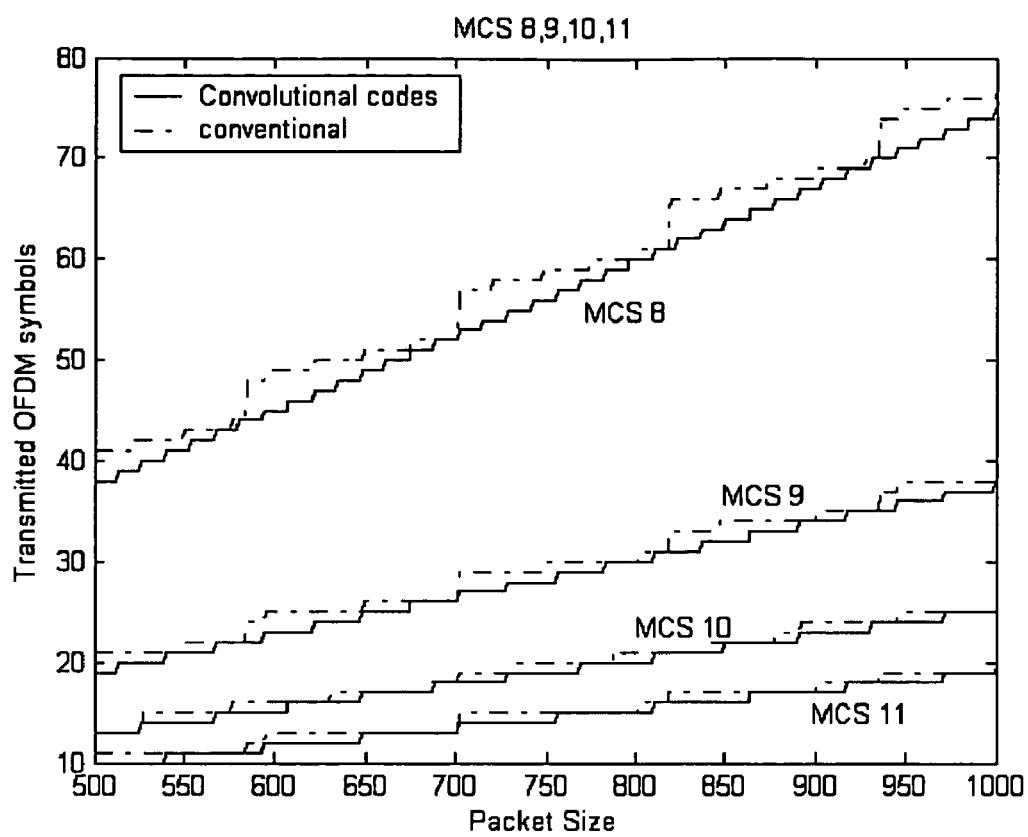
FIG. 1 shows performance graphs illustrating required transmitted OFDM symbols comparison for conventional LPDC concatenation rule with convolutional codes (CC).
Figure 2:
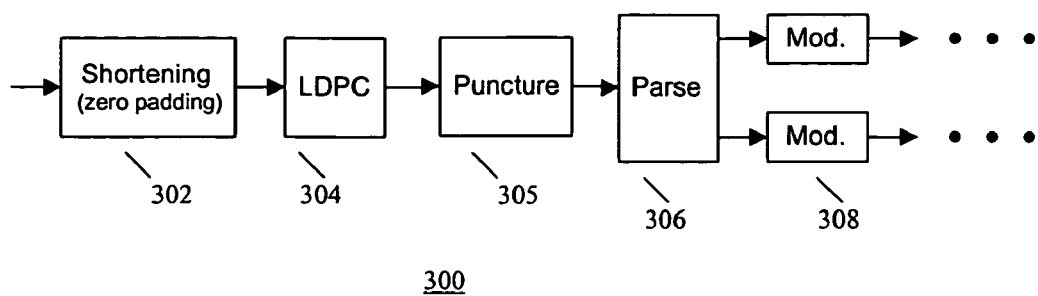
FIG. 2 shows a block diagram of a WLAN transmitter architecture including transmit datapaths with LDPC encoding, according to an embodiment of the present invention.

FIG. 2 shows a functional block diagram of an embodiment of a MIMO WLAN transmitter 300 (e.g., IEEE 802.11) including multiple data transmission paths according to an embodiment of the present invention. The transmitter 300 includes a shortening unit 302, an LPDC encoder 304, a puncturer 305 providing puncturing, a parser 306 and for each transmission path an OFDM modulator 308, implementing an embodiment of the present invention.

The user information bits are passed through the shortening unit 302, and then encoded using a short to moderate block length Low Density Parity Check (LDPC) code in the LDPC Encoder 304. The encoded bits then punctured in puncturer 305 and pass through the round robin spatial parser 306 and then an OFDM modulator 308 for each transmission path. LDPC codes which are designed for parallel implementation provide a good alternative for satisfying stringent requirements in terms of block error rate and decoding throughput.

In one embodiment, the present invention provides improved LDPC code structure and concatenation rules for LPDC data encoding in WLAN systems (e.g., IEEE 802.11n OFDM MIMO systems). In one aspect the present invention provides two code sets per rate, a long one and a short one, for example, a length 1728 and a length 576 codeword. The long code size is chosen based on the coding performance and the decoding latency requirement. The short code size is chosen to be ⅓ of the long code word. Furthermore, both code sizes are selected to be an integer number of OFDM tones. The inventors have found that by choosing the code size to be integer number of OFDM tones, better padding efficiency can be achieved. For example, for a WLAN system with 48 OFDM tones, the 1728 and 576 codes which are integer numbers of 48 are preferred. Different code size should be chosen with different data tones based on this principle. For example, for 52 data tones system, 1872 and 624 codes should be selected. Example code rate, information bit and code word size combination for 48 tones system are shown in Table 2 below.

TABLE 2

Basic code parameter

| Coding Rate | Info. Bits | Code Length | Info. Bits | Code Length |
|---|---|---|---|---|
| ½ | 864 | 1728 | 288 | 576 |
| ⅔ | 1152 | 1728 | 384 | 576 |
| ¾ | 1296 | 1728 | 432 | 576 |
| ⅞ | 1512 | 1728 | 504 | 576 |

Figure 3:
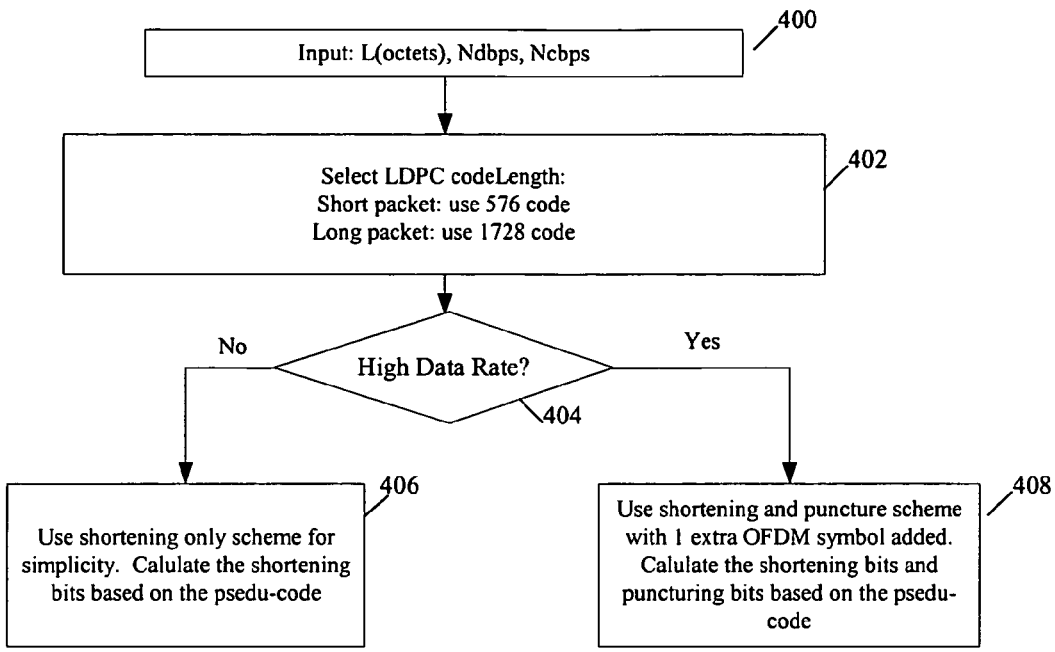
FIG. 3 shows a flowchart of the steps of another implementation of a LDPC concatenation rule according to an embodiment of the present invention, including.

Further, in another aspect the present invention provides a LDPC concatenation rule, wherein in one implementation a maximum of one extra OFDM symbol is added in order to reduce the code set granularity. In general, shortening improves the code performance while puncturing degrades the code performance. In order to guarantee that the code performance is better or the same compared with the original code, more bits are shortened compared with puncturing, by transmitting an extra OFDM symbol. Furthermore, the inventors have found that if the punctured bits are too many, decoding fails regardless of the number of bits shortened. To prevent that result, all the required puncturing and shortening bits are distributed across all codewords. This scheme provides a preferred tradeoff between code complexity and over-the-air efficiency. An example of the above concatenation steps is illustrated by the pseudo-code in Table 3 below, which is an implementation of the steps in the flowchart of FIG. 3 (FIG. 3 is described further below):

TABLE 3

Input parameters:
    HTLENGTH - packet length
    CBPS - coded bits per OFDM symbol
    DBPS - uncoded data bits per OFDM symbol
    $N_{infobits} = 8*L$
  IF ( L ≦ 251 Byte )
    $L_{cword\_selected} = 576$;

TABLE 3-continued

```
    ELSE
        L_cword_selected = 1728;
    END
IF ( N_dbps ≦ 4*N_ofdm_tones ) % Use shortening and puncturing
    N_ofdm = ceil(N_infobits/ N_dbps)+1
    N_cwords = ceil(N_ofdm * N_cbps / L_cword_selected)
    L_cword = floor(N_ofdm * N_cbps / N_cwords)
    N_pad_bits = L_cword * N_cwords * R - N_infobits
    N_puncture_bits = max(0, (L_cword_selected - L_cword)*
N_cwords - N_pad_bits )
    N_pad_bits_pre_cw = floor(N_pad_bits / N_cwords )
    N_puncture_bits_pre_cw = ceil(N_puncture_bits / N_cwords )
ELSE            % Use shortening only
    N_cwords = ceil(N_infobits/ (L_cword_selected * R ))
    K_cword = ceil(N_infobits/ N_cwords)
    N_pad_bits_pre_cw = L_cword_selected * R - K_cword
END
```

As such, the present invention provides a simplified solution to the prior art shortcomings, wherein only 2 codes per rate for both 20 MHz & 40 MHz systems are utilized, and the present invention is extendable to any system parameters. In addition, at most one extra OFDM symbol padding is needed and one code per packet provides uniform performance. Inherent recommendation for LDPC usage is that LDPC is optional, using only shortening the last codeword for high rate, and lower rate transmission requires more complicated concatenation rule. Nor is there a need to update code per packet, wherein easy code optimization is provides with improved system performance.

FIG. 3 shows a flowchart of the steps of an implementation of a LDPC concatenation rule according to an embodiment of the present invention, including:

Step 400: Input parameters—L (packet length), $N_{cbps}$ (coded bits per OFDM symbol) and $N_{dbps}$ (uncoded data bits per OFDM symbol). $N_{ofdm\_tones}$ is the number of OFDM data tones in the system.

Step 402: Select LDPC codeLength, wherein for a short packet (e.g., L≦251 Bytes (packet length threshold)) the 576 code is selected, otherwise, for a long packet (e.g., L>251 Bytes) the 1728 code is selected. The packet length threshold is selected to make sure that with 1728 code the there is no coding gain loss due to shortening and puncturing. Packet length threshold of 251 bytes is selected based on system simulation using 48 data tones. A different packet length threshold should be selected for a different system. More bits are shortened than punctured such that the shortening to puncturing ratio is high enough to prevent coding gain loss. Further the puncturing ratio is limited to a maximum, wherein the maximum is also selected based on simulation observation. The inventors have found that in general, puncture ratio greater than e.g. 30-40% of the code length incurs large performance degradation.

Step 404: Determine if the transmission data rate is high (e.g., higher data rate corresponding to larger $N_{dbps}$). In the above system with 48 tones, when $N_{dbps}$ is greater than 192 (which is corresponding to 48 Mbps transmission rate) high transmission rate diagram is used, otherwise, low transmission rate diagram is used.

Figure 4:
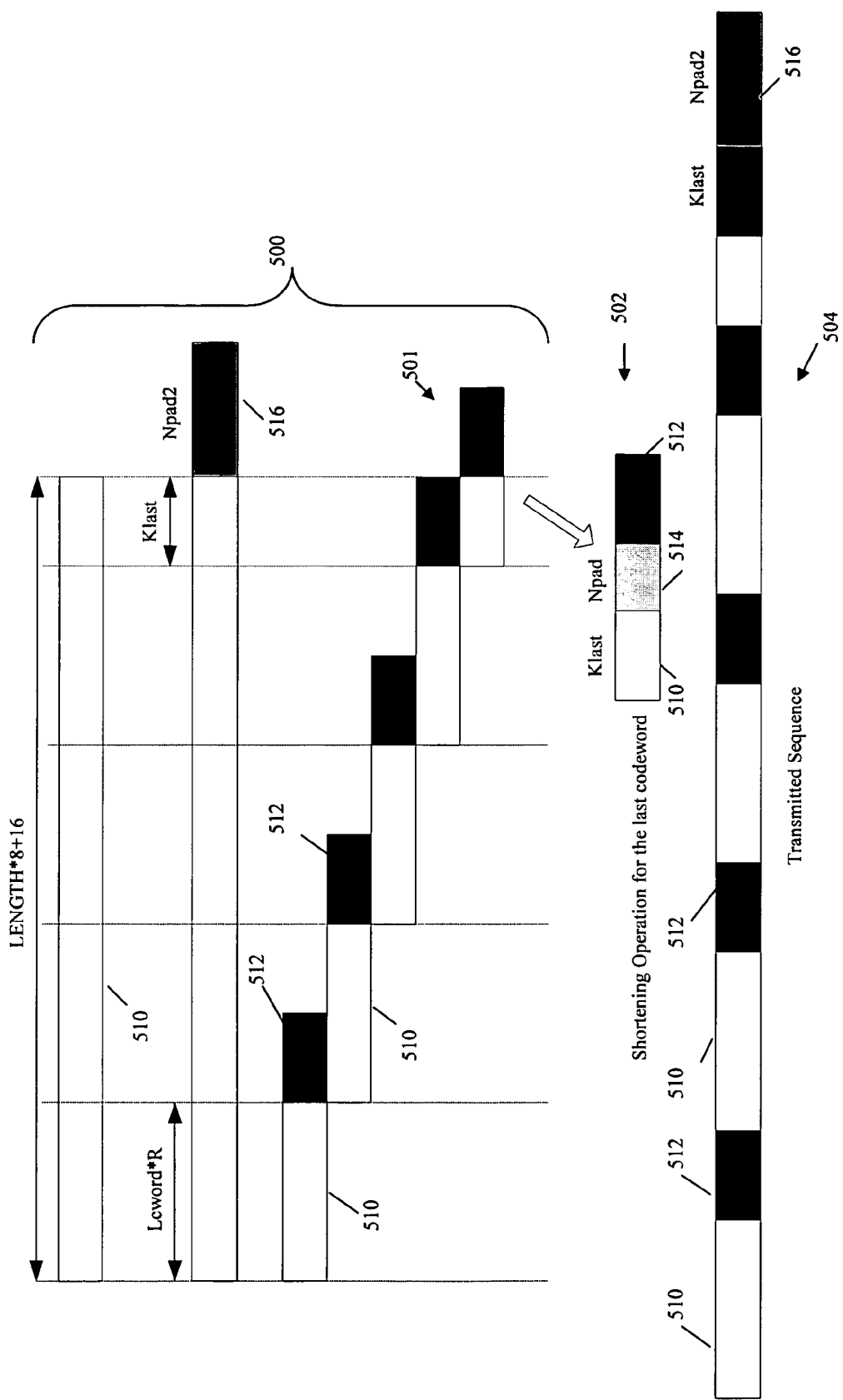
FIG. 4 shows an example encoding procedure according to the present invention where shortening-only is applied (low data rate transmission).

Step 406: If transmission data rate is not high, then use shortening-only scheme and calculate the shortening bits as discussed (e.g., pseudo-code). FIG. 4 shows an example encoding procedure according to the present invention where shortening-only is applied (low data rate transmission), showing a codeword 500 (LENGTH*8+16) wherein shortening operation is performed for the last codeword 501 generating the shortened last codeword 502, resulting in the transmission sequence 504. In FIG. 4, blocks 510 represent the information bits; block 512 represent the parity check bits after encoding; block 514 represents the all zero shortening bits which are inserted for encoding but not transmitted; block 516 is the extra padding bits which are transmitted to meet the OFDM boundary.

Figure 5:
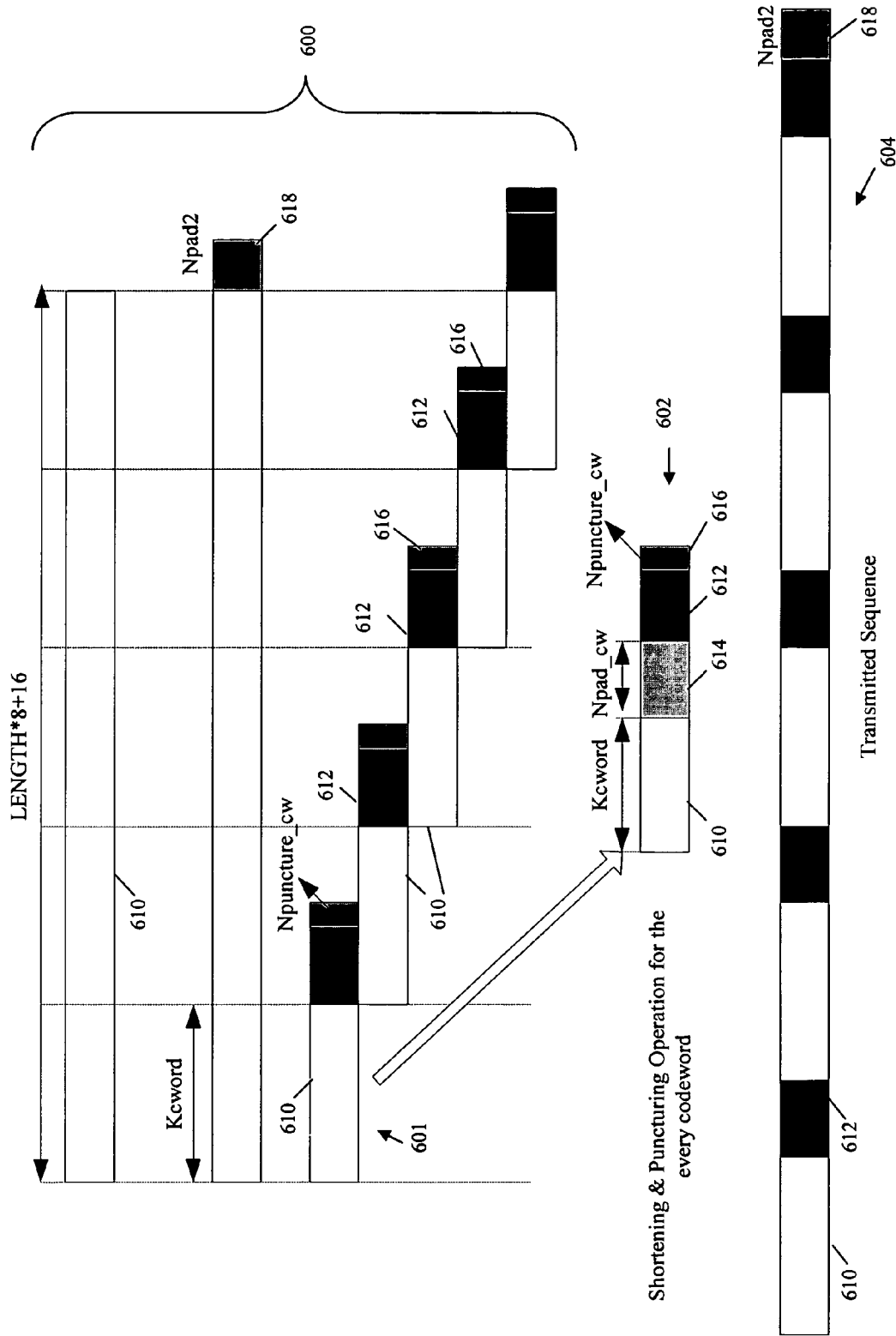
FIG. 5 shows an example encoding procedure according to the present invention where the shortening-and-puncturing scheme is used (high data rate transmission).

Step 408: If the transmission data rate is high, then use shortening-and-puncturing schemes with one extra OFDM symbol added, and calculate the shortening bits and puncturing bits as discussed (e.g., pseudo-code). FIG. 5 shows an example encoding procedure according to the present invention where the shortening-and-puncturing scheme is used (high data rate transmission), showing a codeword 600 (LENGTH*8+16) wherein shortening and puncturing operation is performed over every codeword 601 to generate a corresponding codeword 602, resulting in the transmission sequence 604. In FIG. 5, the blocks 610 represents the information bits; blocks 612 represent the parity check bits after encoding; block 614 represents the all zero shortening bits which are inserted for encoding but not transmitted; blocks 616 represent the punctured parity bits which are removed from the parity bits and not transmitted; block 618 is the extra padding bits which are transmitted to meet the OFDM boundary.

In one example according to the present invention, the high/low rate threshold is selected based on the LDPC code length and system parameters. The shortening only scheme is very simple compared to shortening/puncturing scheme, so preferably the shortening only scheme is applied as much as possible. However, shortening only scheme incurs more than one OFDM symbol transmission overhead at low data rate. As such, the high/low rate threshold is selected so that when the transmission rate is above the threshold, applying shortening only scheme incur maximum one extra OFDM transmission, while when the transmission rate is lower than the threshold, more than one extra OFDM symbol is required for transmission. The exact threshold varies with the system parameters. In the example herein, with 48 tones, the threshold is selected as 196.

FIGS. 6-12 Show examples of performance of a LPDC concatenation rule according to the present invention, evaluated in terms of the transmitted OFDM symbols, the padding and puncturing bits needed for lower coding and modulation mode, and the bit error rate (BER) performance of the code wherein the worst case puncturing and shortening happens.

Figure 6:
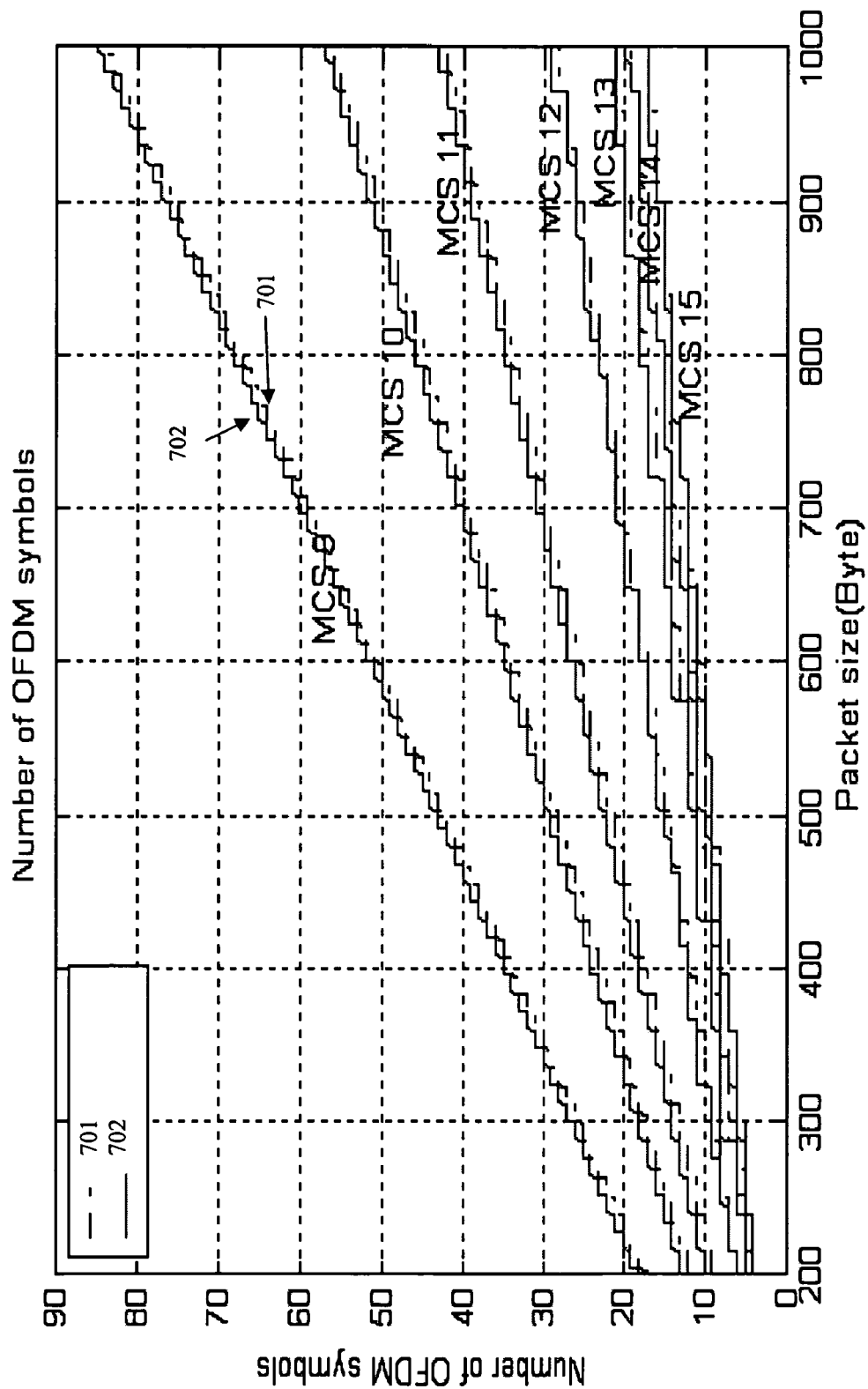
FIG. 6 shows example performance of an LDPC concatenation rule according to an embodiment of the present invention in terms of the number of transmitted OFDM symbols versus packet size (Byte).

FIG. 6 shows graphs 700 of the transmitted OFDM symbols versus packet size for a 20 MHz OFDM system configuration. For all the MCS (modulation and coding set), only one extra OFDM symbol is needed to be transmitted. The legend 701 in FIG. 6 refers to graphs for transmitted OFDM symbols using convolutional codes (CC), for MCS9, MCS10, MCS11, MCS12, MCS13, MCS 14 and MCS15, as shown. Since convolutional codes are not block codes and do not have the code length constraint, it provides the benchmark for OFDM padding efficiency comparison. The legend 702 in FIG. 6 refers to the corresponding transmitted OFDM symbols using a LDPC concatenation rule according to an embodiment of the present invention using Shortening/Puncturing.

Figure 7:
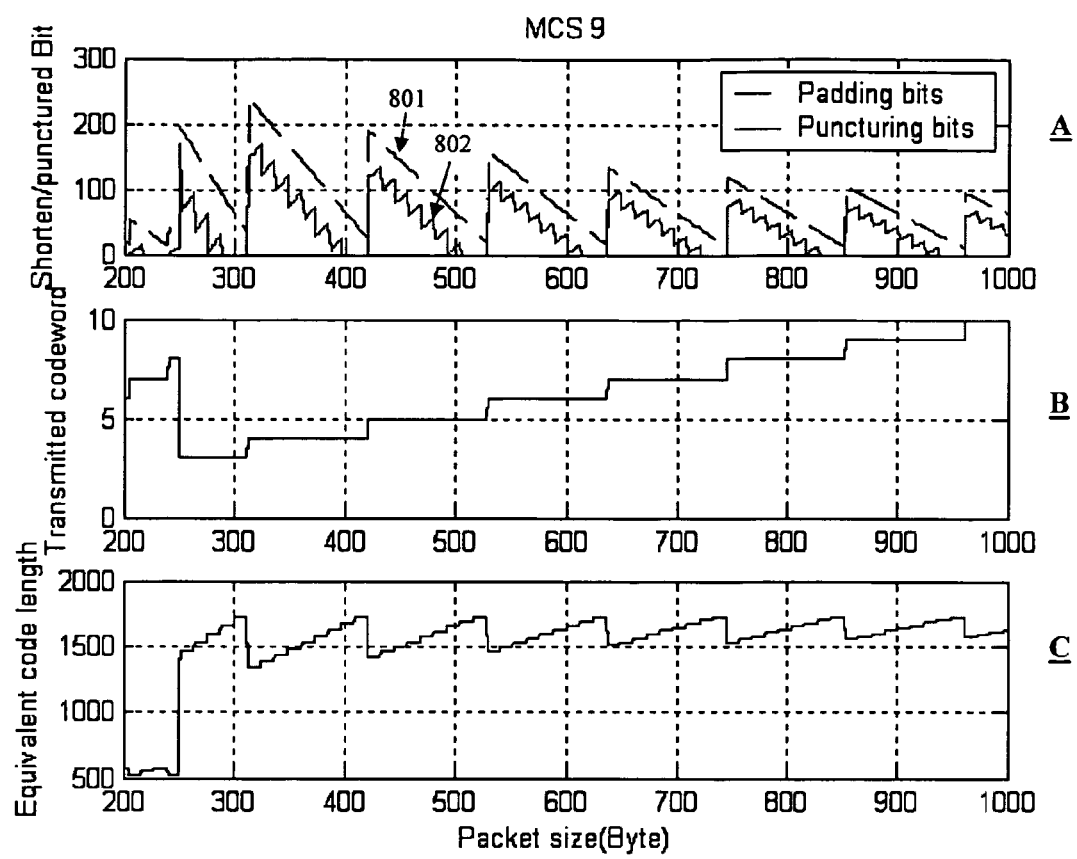
FIG. 7 shows example performance of an LDPC concatenation rule according to an embodiment of the present invention in terms of the required puncturing and padding bits per codeword, number of codeword and the equivalent code length, for MCS 9.

FIG. 7 shows example performance of an LDPC concatenation rule according to an embodiment of the present invention in terms of the required puncturing and padding bits per codeword, number of codeword and the equivalent code length, for MCS 9. FIG. 7 shows three subplots designated as A, B and C. In subplot A, the x-axis (horizontal) represents the packet length and the y-axis (vertical) represents number of bits. The legend "padding bits" 801 refers to $N_{pad\_bits\_pre\_cw}$ corresponding to different packet length. The legend "punctured bits" 802 refers to $N_{puncture\_bits\_pre\_cw}$ corresponding to different packet length, both calculated following the concatenation rules above. It is easily seen that by adding one extra OFDM symbol, the shortening bits is always larger than the puncture bit. In subplot B, the x-axis represents the packet length, the y-axis represents the number of LDPC codewords, wherein the subplot B shows the transmitted LDPC codewords $N_{ofdm}$ corresponding to different packet length. In subplot C, the x-axis represents the packet length, the y-axis represents equivalent LDPC code length after shortening and puncturing $L_{cword}$, wherein the subplot C shows the equivalent code size after the shortening and puncturing operation.

Figure 8:
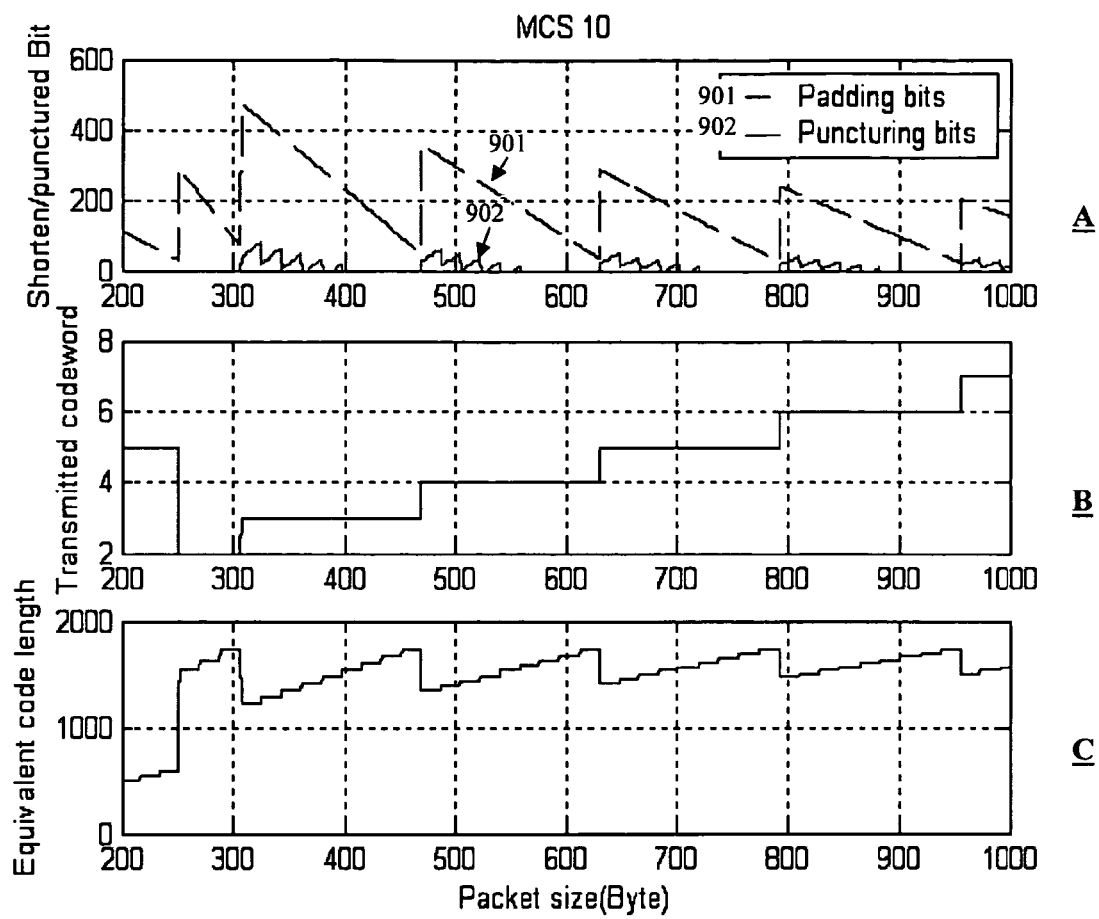
FIG. 8 shows example performance of an LDPC concatenation rule according to an embodiment of the present invention in terms of the required puncturing and padding bits per codeword, number of codeword and the equivalent code length, for MCS 10.

FIG. 8 shows example performance of an LDPC concatenation rule according to an embodiment of the present invention in terms of the required puncturing and padding bits per codeword, number of codeword and the equivalent code length, for MCS 10. The example in FIG. 8 shows three subplots A, B and C, which are similar to those in FIG. 7, but for MCS 10.

Figure 9:
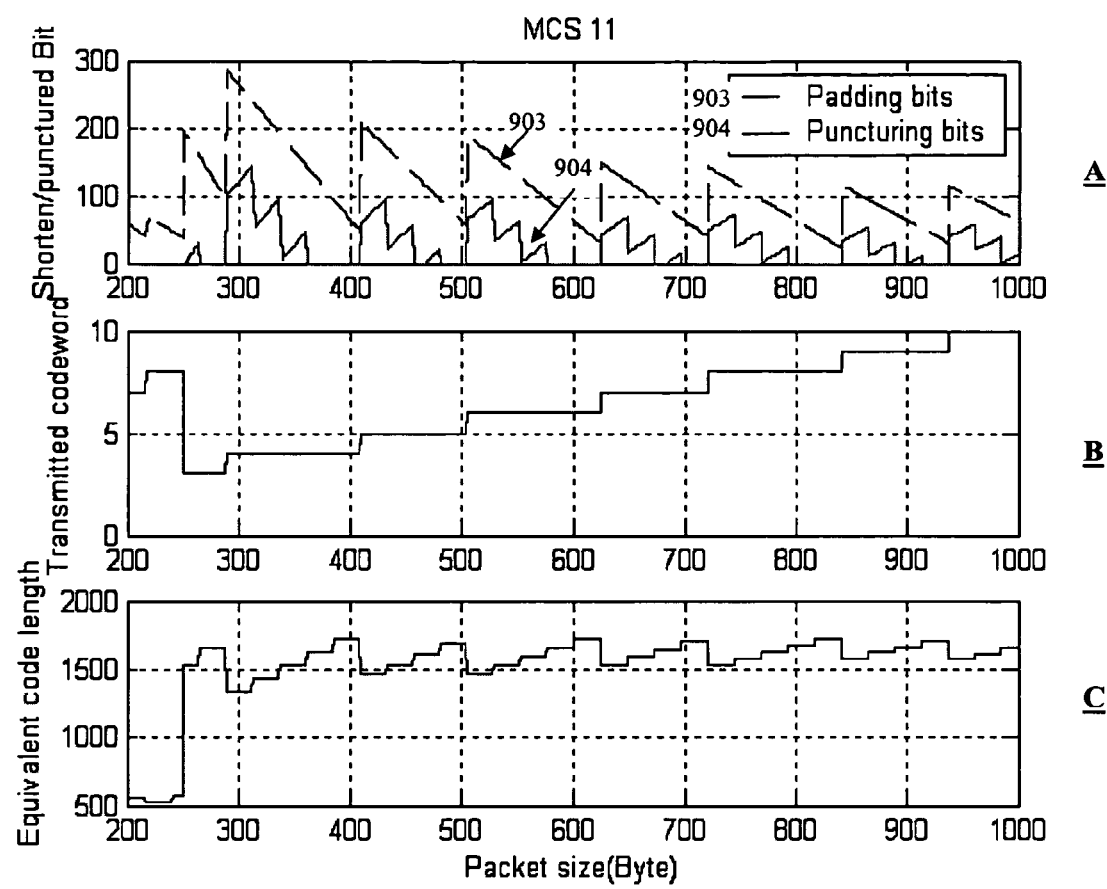
FIG. 9 shows example performance of an LDPC concatenation rule according to an embodiment of the present invention in terms of the required puncturing and padding bits per codeword, number of codeword and the equivalent code length, for MCS 11.

FIG. 9 shows example performance of an LDPC concatenation rule according to an embodiment of the present invention in terms of the required puncturing and padding bits per codeword, number of codeword and the equivalent code length, for MCS 11. The example in FIG. 10 shows three subplots A, B and C, which are similar to those in FIG. 7, but for MCS 11.

Figure 10:
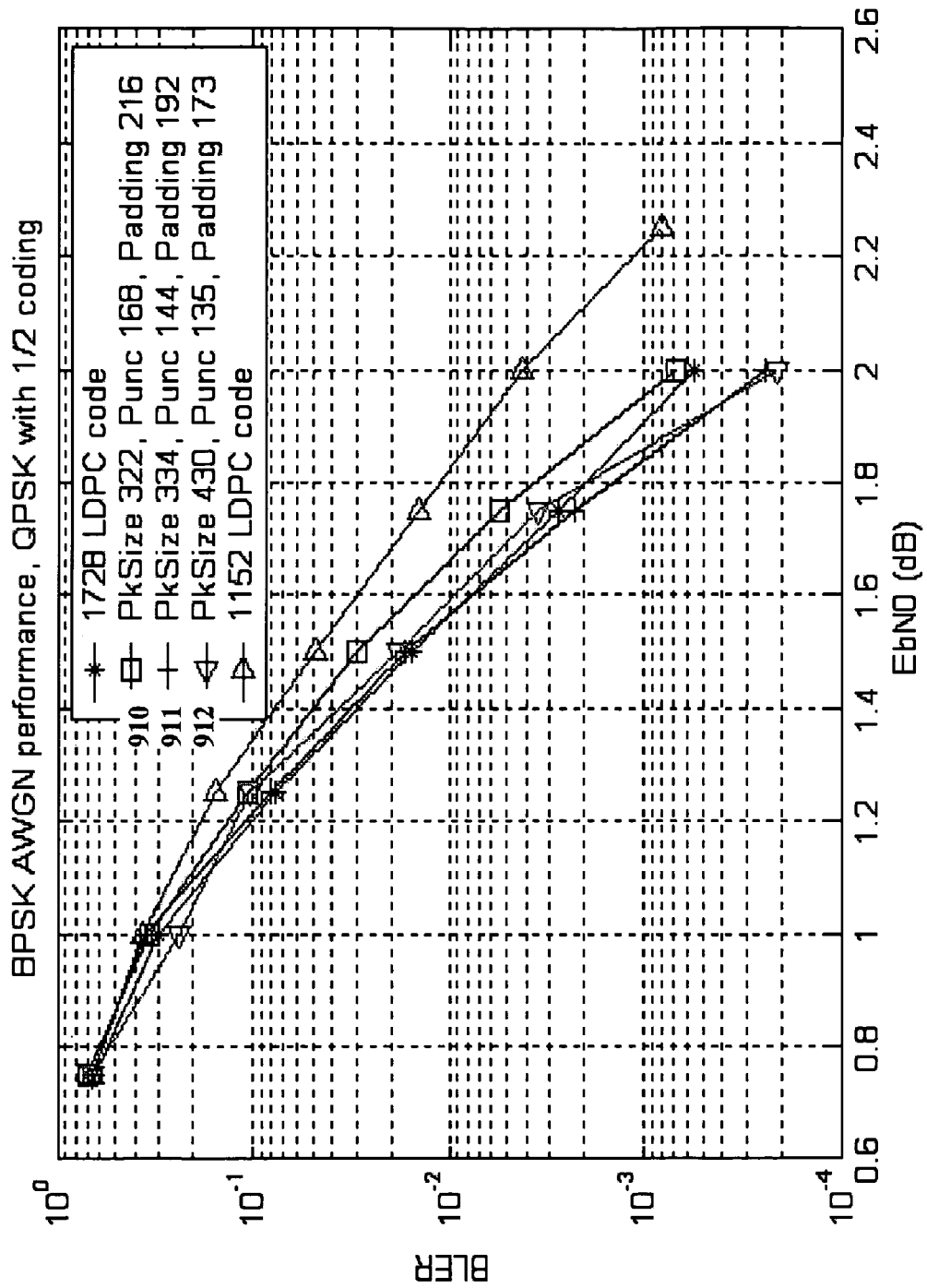
FIG. 10 shows the BER performance of the worst case punctured and shortened LDPC code over AWGN channel (QPSK ½ code).
Figure 11:
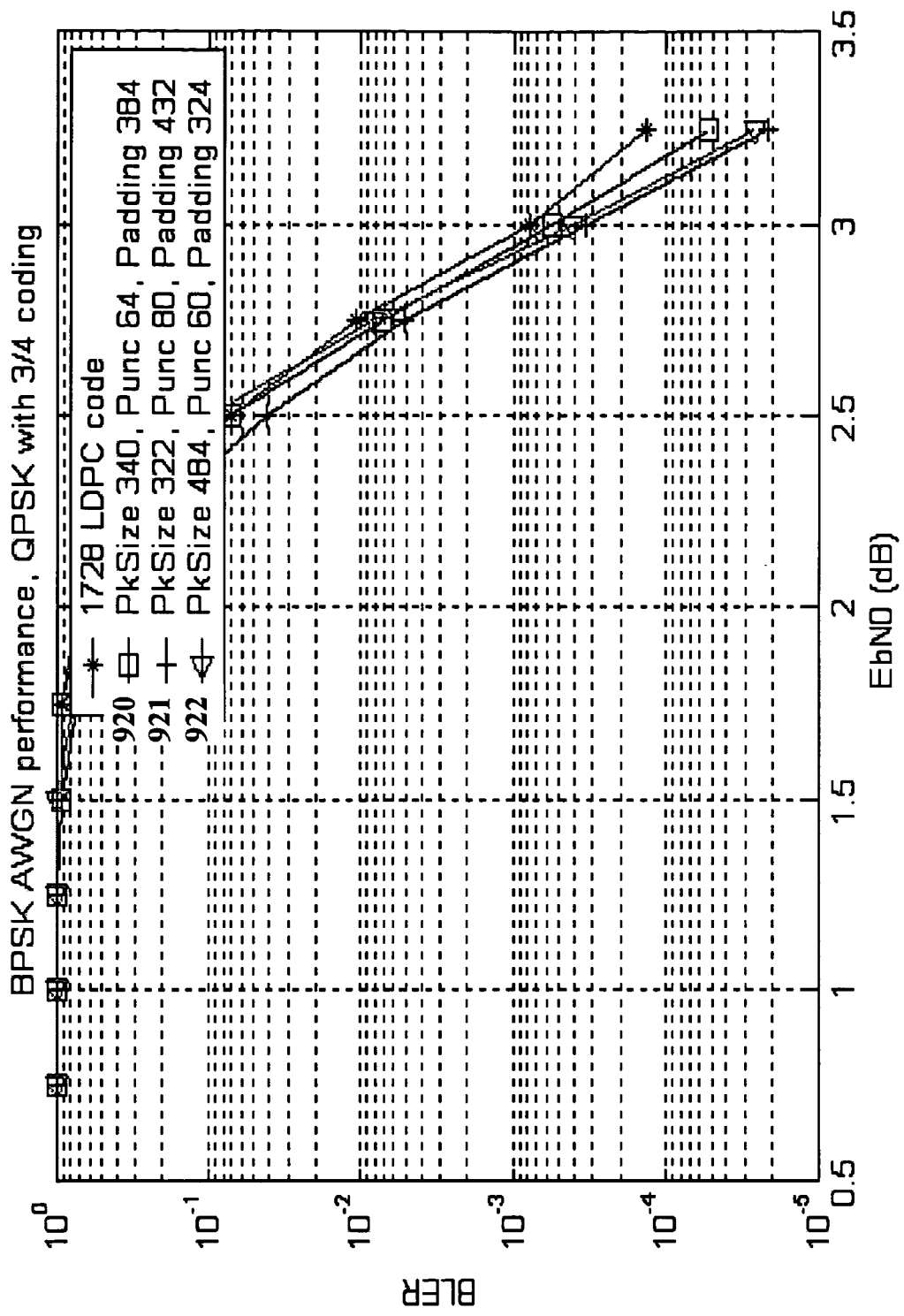
FIG. 11 shows the BER performance of the worst case punctured and shortened LDPC code over AWGN channel (QPSK ¾ code).
Figure 12:
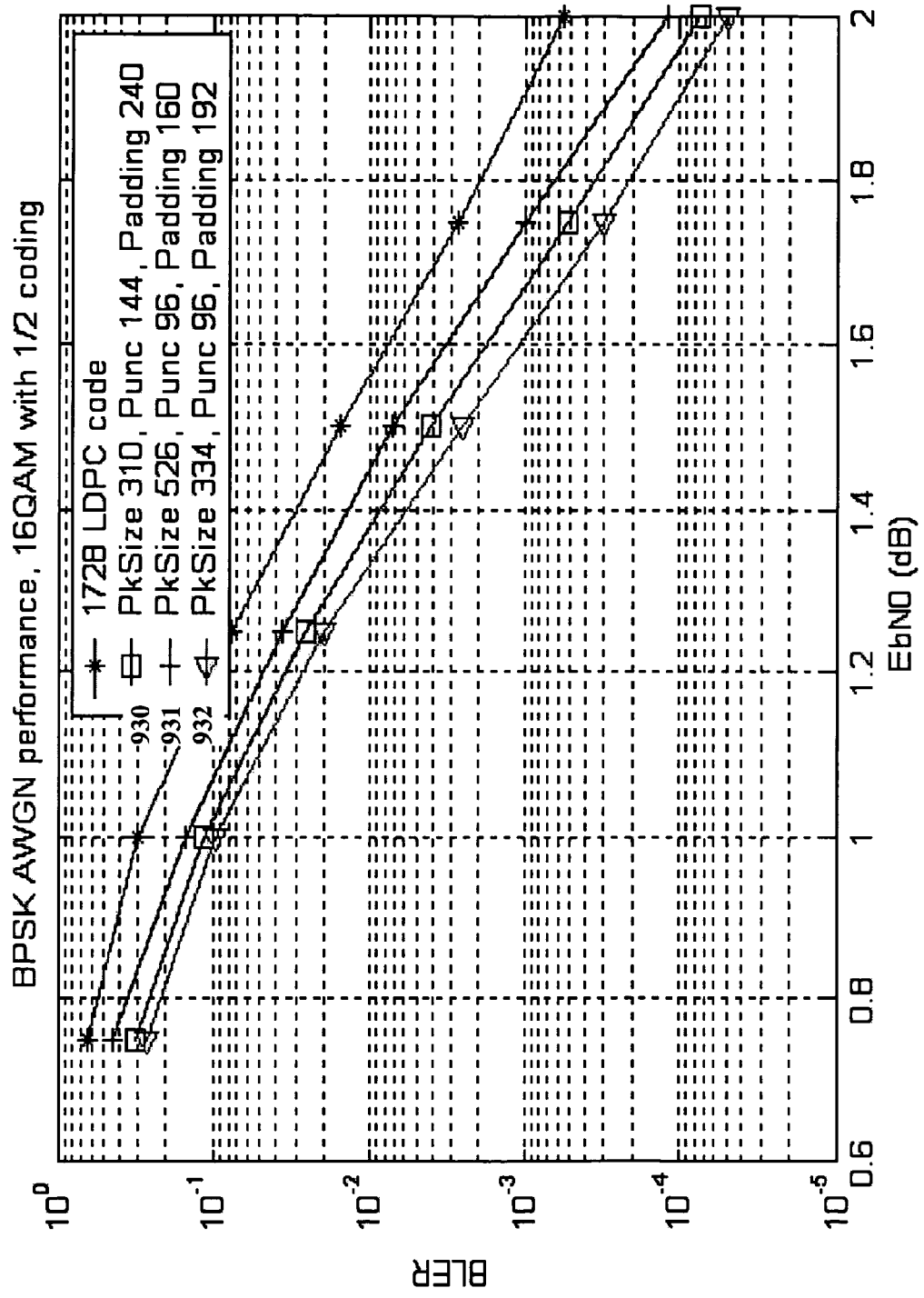
FIG. 12 shows the BER performance of the worst case punctured and shortened LDPC code over AWGN channel (16QAM ½ code).

FIGS. 10-12 show the BER performance of the worst case punctured and shortened LDPC code over AWGN channel. Specifically, FIG. 10 shows the BER performance of the worst case punctured and shortened LDPC code over AWGN channel (QPSK ½ code). FIG. 11 shows the BER performance of the worst case punctured and shortened LDPC code over AWGN channel (QPSK ¾ code). FIG. 12 shows the BER performance of the worst case punctured and shortened LDPC code over AWGN channel (16QAM ½ code). In FIG. 10, example cases 910, 911, 912 according to an embodiment of the present invention with the packet size (Byte), punctured bits (bits) and padded bits (bits) are shown in the legend correspondingly. In FIG. 11, example cases 920, 921, 922 according to an embodiment of the present invention with the packet size (Byte), punctured bits (bits) and padded bits (bits) are shown in the legend correspondingly. In FIG. 12, example cases 930, 931, 932 according to an embodiment of the present invention with the packet size (Byte), punctured bits (bits) and padded bits (bits) are shown in the legend correspondingly.

An alternative embodiment of the present invention involves optimizing the packet size threshold for some smaller number. Further, the MCS selection threshold, which in the example above is set to $4*N_{ofdm\_tones}$ to a fixed number (e.g., $N_{ofdm\_tones}=48$, provides $4*48=192$), can also be changed to an optimal number. In another alternative, the shortening is only for the long packet and higher MCS set is for the last codeword only (it is only applicable for all the codewords like the short packet for unification).

The present invention has been described in considerable detail with reference to certain preferred versions thereof; however, other versions are possible. Therefore, the spirit and scope of the appended claims should not be limited to the description of the preferred versions contained herein.

What is claimed is:

1. In a wireless communication system, an encoding method for coding data for transmission, comprising the steps of:
   encoding the data into Low Density Parity Check (LDPC) codewords using LDPC code sets including codewords,
   adding padding bits by concatenating a maximum of one additional OFDM symbol to a codeword, thereby minimizing code set granularity; and
   distributing all required puncturing and shortening bit positions across all codewords, for tradeoff between code complexity and over-the-air efficiency, wherein, and the codewords are punctured shortened LDPC codewords.

2. The method of claim 1, further including the steps of including one codeword per data packet for uniform performance.

3. The method of claim 1 further including the steps of distributing shortening and puncturing bit positions across all codewords to limit the number of punctured bits and prevent decoding failure.

4. The method of claim 1 further including the steps of distributing shortening and puncturing bit positions across all codewords to provide uniform performance for all codewords, and improve packet error rate.

5. The method of claim 1 wherein more bits are shortened than punctured such that the shortening to puncturing ratio is high enough to prevent coding gain loss.

6. The method of claim 5, wherein the step of concatenating a maximum of one additional OFDM symbol to a codeword ensures that the shortening to puncturing ratio is high enough to prevent coding gain loss.

7. The method of claim 5 wherein said ratio is limited to a maximum value.

8. The method of claim 1, wherein the codewords are punctured shortened LDPC codewords with more shortening than puncturing.

9. The method of claim 8, wherein the steps of encoding further include the step of, for each data packet comprising one or more data words:
   obtaining the packet length;
   selecting an LDPC code length as a function of the packet length;
   if the transmission rate is higher than the threshold, then performing shortening and puncturing before padding, otherwise, performing shortening only.

10. The method of claim 9, wherein the LDPC code length selected fills an integer number of OFDM data carriers.

11. The method of claim 9, further comprising selecting said threshold based on the LDPC code length and system parameters.

12. The method of claim 11 further including the steps of:
   selecting the threshold such that when the transmission rate is above the threshold, then applying shortening and puncturing with one OFDM symbol added, while when the transmission rate is lower than the threshold applying shortening-only.

13. The method of claim 9, further comprising the steps of providing two code sets per coding rate, one code set having a length ⅓ of the other code set, wherein selecting LDPC code length further includes the steps of:
   for a short packet length, selecting the shorter code set,
   for a long packet length, selecting the longer code set.

14. The method of claim 13, wherein selecting LDPC code length further includes the steps of:
   for a short packet length, selecting a 576 length code set,
   for a long packet length, selecting a 1728 length code set.

15. The method of claim 14 wherein a packet length threshold is selected to ensure no coding gain loss due to shortening and puncturing.

16. The method of claim 14 wherein said code sets comprise:

| Coding Rate | Info. Bits | Code Length | Info. Bits | Code Length |
|---|---|---|---|---|
| 1/2 | 864 | 1728 | 288 | 576 |
| 2/3 | 1152 | 1728 | 384 | 576 |
| 3/4 | 1296 | 1728 | 432 | 576 |
| 7/8 | 1512 | 1728 | 504 | 576. |

17. A transmitter in a wireless communication system comprising:
 an encoder configured to encode data into Low Density Parity Check (LDPC) codewords using LDPC code sets including codewords, and to add padding bits by concatenating a maximum of one additional OFDM symbol to a codeword, thereby minimizing code set granularity, upon a transmission rate exceeding a threshold;
 a shortening unit configured to shorten the code words; and
 a puncturer configured to puncture the LDPC code words, wherein more bits are shortened than punctured such that the shortening to puncturing ratio is high enough to prevent coding gain loss.

18. A wireless communication system comprising:
 a shortening unit configured to shorten codewords;
 an encoder configured to encode data into Low Density Parity Check (LDPC) codewords using LDPC code sets including codewords, and to add padding bits by concatenating a maximum of one additional OFDM symbol to a codeword, thereby minimizing code set granularity, upon a transmission rate exceeding a threshold; and
 a puncturer configured to puncture the LDPC codewords, wherein the codewords are punctured shortened LDPC codewords with more shortening than puncturing.

19. The wireless communication system of claim 18, wherein more bits are shortened by the shortening unit than punctured by the puncturer such that the shortening to puncturing ratio is high enough to prevent coding gain loss.

20. In a wireless communication system, an encoding method for coding data for transmission, comprising the steps of:
 encoding the data into Low Density Parity Check (LDPC) codewords using LDPC code sets including codewords, and
 adding padding bits by concatenating a maximum of one additional OFDM symbol to a codeword, thereby minimizing code set granularity,
wherein the codewords are punctured shortened LDPC codewords with more shortening than puncturing.

* * * * *